(12) United States Patent
Bouche et al.

(10) Patent No.: US 9,640,625 B2
(45) Date of Patent: May 2, 2017

(54) SELF-ALIGNED GATE CONTACT FORMATION

(71) Applicant: GLOBALFOUNDRIES Inc., Grand Cayman (KY)

(72) Inventors: Guillaume Bouche, Albany, NY (US); Andy Chih-Hung Wei, Queensbury, NY (US); Gabriel Padron Wells, Saratoga Springs, NY (US); Andre P. Labonte, Mechanicville, NY (US); Jing Wan, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 137 days.

(21) Appl. No.: 14/261,823

(22) Filed: Apr. 25, 2014

(65) Prior Publication Data

US 2015/0311082 A1    Oct. 29, 2015

(51) Int. Cl.
```
H01L 29/76      (2006.01)
H01L 29/417     (2006.01)
H01L 21/768     (2006.01)
```

(52) U.S. Cl.
CPC .. *H01L 29/41775* (2013.01); *H01L 21/76804* (2013.01); *H01L 21/76831* (2013.01); *H01L 21/76895* (2013.01); *H01L 21/76897* (2013.01)

(58) Field of Classification Search
CPC ............. H01L 21/28008; H01L 21/283; H01L 29/41775
See application file for complete search history.

(56) References Cited

U.S. PATENT DOCUMENTS

| | | | |
|---|---|---|---|
| 6,194,301 B1 | 2/2001 | Radens et al. | |
| 6,274,471 B1 | 8/2001 | Huang | |
| 7,115,491 B2 | 10/2006 | Huang et al. | |
| 7,563,701 B2 | 7/2009 | Chang et al. | |
| 8,563,425 B2 | 10/2013 | Schultz | |
| 2012/0153383 A1* | 6/2012 | Shin .................. | H01L 21/76816 257/331 |
| 2012/0187418 A1* | 7/2012 | Yin ....................... | H01L 29/785 257/77 |
| 2014/0346575 A1* | 11/2014 | Chen ................. | H01L 21/76897 257/288 |

* cited by examiner

*Primary Examiner* — Marc Armand
*Assistant Examiner* — Sarah Salerno
(74) *Attorney, Agent, or Firm* — Williams Morgan, P.C.

(57) ABSTRACT

Provided are approaches for forming gate and source/drain (S/D) contacts. Specifically, a gate contact opening is formed over at least one of a set of gate structures, a set of S/D contact openings is formed over fins of the semiconductor device, and a metal material is deposited over the semiconductor device to form a gate contact within the gate contact opening and a set of S/D contacts within the set of S/D contact openings. In one approach, nitride remains between the gate contact and at least one of the S/D contacts. In another approach, the device includes merged gate and S/D contacts. This approach provides selective etching to partition areas where oxide will be further removed selectively to nitride to create cavities to metallize and create contact to the S/D, while isolation areas between contact areas are enclosed in nitride and do not get removed during the oxide etch.

14 Claims, 16 Drawing Sheets

SELF-ALIGNED GATE CONTACT FORMATION

BACKGROUND

Technical Field

This invention relates generally to the field of semiconductors, and more particularly, to approaches used in forming contacts in semiconductor devices.

Related Art

A typical integrated circuit (IC) chip includes a stack of several levels or sequentially formed layers of shapes. Each layer is stacked or overlaid on a prior layer and patterned to form the shapes that define devices (e.g., fin-type field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FinFET is formed by the intersection of two shapes, i.e., a gate layer rectangle on a silicon island formed from the silicon surface layer. Each of these layers of shapes, also known as mask levels or layers, may be created or printed optically through well-known photolithographic masking, developing and level definition, e.g., etching, implanting, deposition, etc.

For FinFET devices, it is typical to have a source/drain contact strap over an active region (Rx) to make sure all FINs are connected by contact. Prior art approaches consist of etching a contact hole in the contact strap layer (TS), or contact layer, and then filling the hole with a metal to contact source and drain. The shape of the contact plug is dictated by the shape of the hole, which is usually tapered, yet close to vertical. However, with the current tapered shape of contacts to source and drain, it becomes difficult to expect yield for a contact that allows contact resistance in specification, while avoiding bridging at the top of adjacent contacts.

Another issue with current art approaches is performing a uniform, repeatable contact to the S/D areas. With FinFET technology, a contact area typically encompasses a number of fins. Because of process variability and design rules constraints related to crowding at the top of the contacts, design becomes problematic at 14 nm and smaller because the fin located on the edge of the contact receives only partial coverage with the contact metal, thus resulting in an increased resistance.

In another prior art approach, middle of line (MOL) processing for 14 nm FinFET fully encapsulates the gate in nitride. A contact to S/D is etched through oxide, selectively to nitride (TS level). This contact is therefore self-aligned. After TS metallization and CMP, an Inter-Layer Dielectric (ILD) film is deposited, and the S/D contact to TS and gate contact are processed. However, the S/D and gate contacts are not self-aligned, and thus susceptible to shorting.

SUMMARY

In general, provided herein are approaches for forming gate and source/drain (S/D) contacts. Specifically, a semiconductor device includes a gate contact opening formed over at least one of a set of gate structures, a set of S/D contact openings formed over fins of the semiconductor device, and a metal material deposited over the semiconductor device to form a gate contact within the gate contact opening and a set of S/D contacts within the set of S/D contact openings. In one approach, a layer of oxide and nitride remains between the gate contact and at least one of the set of S/D contacts following formation. This scheme is compatible with a source-drain contact replacement process and, in addition, provides a way to self-align the gate contact so that the risk of shorting the gate contact and the S/D contacts is reduced by the inclusion of the nitride barrier. In another approach, the semiconductor device includes merged gate and S/D contacts. This scheme makes use of oxide and nitride, and associated selective etches to partition areas where oxide will be further removed selectively to nitride to create cavities to metallize and create contact to the S/D, while isolation areas between contact areas are enclosed in nitride and do not get removed during the oxide etch.

One aspect of the present invention includes a method of forming a semiconductor device, the method comprising: forming a set of gate structures over a substrate; patterning a sacrificial layer to form a set of contact placeholders over a set of fins formed from the substrate; etching a hard mask layer from the set of contact placeholders to expose the sacrificial layer; forming a gate contact opening by etching an oxide over at least one of the set of gate structures; forming a set of source/drain (S/D) contact openings in the semiconductor device by removing the sacrificial layer from atop the set of fins; and depositing a metal material over the semiconductor device to form a gate contact within the gate contact opening and a set of S/D contacts within the set of S/D) contact openings.

Another aspect of the present invention includes a method for forming self-aligned contacts in a semiconductor device, the method comprising: forming a set of gate structures over a substrate; patterning a sacrificial layer to form a set of contact placeholders over a set of fins formed from the substrate; etching a hard mask layer from the set of contact placeholders to expose the sacrificial layer; forming a gate contact opening by etching an oxide over at least one of the set of gate structures; forming a set of source/drain (S/D) contact openings in the semiconductor device by removing the sacrificial layer from atop the set of fins; and depositing a metal material over the semiconductor device to form a gate contact within the gate contact opening and a set of S/D contacts within the set of S/D contact openings.

Another aspect of the present invention includes a semiconductor device including a set of self-aligned contacts, the semiconductor device comprising: a gate contact opening formed by etching a fillable material over at least one of a set of gate structures; a set of source/drain (S/D) contact openings formed in the semiconductor device by removing a sacrificial layer from atop a set of fins formed from a substrate; and a metal material deposited over the semiconductor device to form a gate contact within the gate contact opening and a set of S/D contacts within the set of S/D contact openings.

BRIEF DESCRIPTION OF THE DRAWINGS

These and other features of this invention will be more readily understood from the following detailed description of the various aspects of the invention taken in conjunction with the accompanying drawings in which.

Figure 1:
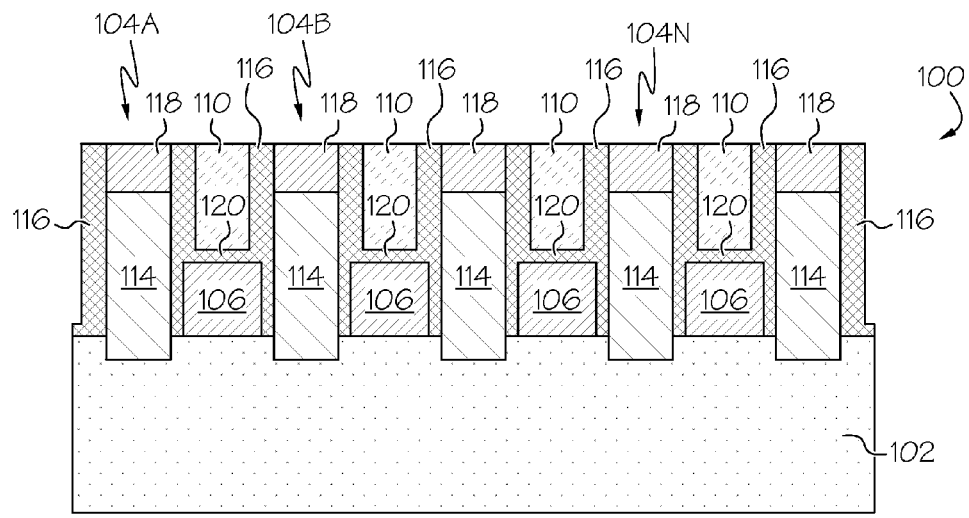
FIG. 1 shows a side cross-sectional view of a set of gate structures formed over a substrate of a semiconductor device according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which one or more approaches are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As stated above, embodiments herein provide approaches for forming gate and source/drain (S/D) contacts. Specifically, the semiconductor device includes a gate contact opening formed over at least one of a set of gate structures, a set of S/D contact openings formed over fins of the semiconductor device, and a metal material deposited over the semiconductor device to form a gate contact within the gate contact opening and a set of S/D contacts within the set of S/D contact openings. In one approach, a layer of oxide and nitride remains between the gate contact and at least one of the set of S/D contacts following formation. This scheme is compatible with a source-drain contact replacement scheme and, in addition, provides a way to self-align the gate contact so that any risk of shorting the gate contact and the S/D contacts is eliminated by the inclusion of the nitride barrier. In another approach, the semiconductor device includes a higher density area and a lower density area, wherein at least one of the set of gate contacts is formed in the lower density area, and wherein a merged gate contact and S/D contact is formed in the higher density area. This scheme makes use of oxide and nitride, and associated selective etches to partition areas where oxide will be further removed selectively to nitride to create cavities to metallize and create contact to S/D, while isolation areas between contact areas are enclosed in nitride and do not get removed during the oxide etch.

With reference now to the figures, FIG. 1 shows a semiconductor device 100 (e.g., a FinFET device) having a substrate 102 and a set of gate structures 104A-N (e.g., replacement metal gates (RMG)) formed over substrate 102. Device 100 further comprises a set of fins 106 formed from substrate 102, and an oxide material 110 formed between each of gate structures 104A-N.

The term "substrate" used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or the entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Gate structures 104A-N are shown following a self-aligned contact (SAC) SiN CMP and RMG formation process in which each gate structure 104A-N is opened and then filled with a recessed gate dielectric and metal stack 114 (e.g., $HfO_2$ as gate dielectric, TiN and W as gate metal), a spacer protection layer 116 (e.g., SiN or SiOCN low k), and a capping layer 118 (e.g., SiN or SiOCN low k). Capping layer 118 is formed by recessing with etch the metal gate then depositing SiN followed by chemical mechanical planarization (CMP). As understood to those skilled in the art, the CMP process involves contacting a material layer to be polished with a rotating polishing pad. An abrasive slurry comprising an abrasive suspended in an aqueous solution, which may also contain chemical constituents to achieve selectively, is disposed between the polishing pad and the material layer to be polished. The material layer to be polished is then polished away with the polish pad and slurry to achieve a desired removal.

Fins 106 may be fabricated using any suitable process including one or more photolithography and etch processes. The photolithography process may include forming a photoresist layer (not shown) overlying substrate 102 (e.g., on a silicon layer), exposing the resist to a pattern, performing post-exposure bake processes, and developing the resist to form a masking element including the resist. The masking element may then be used to etch fins 106 into the silicon layer, e.g., using reactive ion etch (RIE) and/or other suitable processes. In one embodiment, fins 106 are formed using a sidewall image transfer technique. In yet another embodiment, fins 106 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, but not limited to, double exposure (e.g., using two mask sets), forming spacers adjacent features and removing the features to provide a pattern of spacers, resist freezing, and/or other suitable processes.

The resulting structure includes set of fins 106 having sidewalls being substantially orthogonal to a top surface of substrate 102. In an alternative embodiment, fins 106 may be epitaxially grown from a top surface of substrate 102 within trenches or openings formed in a patterned layer atop substrate 102. Fins 106 serve as the fin structure for device 100. The FinFET device may comprise a single fin or multiple fins. As shown in FIG. 1, a nitride layer 120 is formed atop each of fins 106 after the gate RMG process so as to act as a Contact Etch Stop Layer (CESL) during further processing of the source/drain contact etch.

Although not specifically shown for the sake of brevity, semiconductor 100 further includes a set of S/D features formed on opposite sides of a channel region. The S/D features may be formed by recessing a portion of substrate 102 to form source/drain recessing trenches and epitaxially growing a semiconductor material layer in the sources/drains recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), or gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features may be formed by one or more epitaxy or epitaxial (epi) processes. The S/D features may be in-situ doped during the epi process. For example, the epitaxially grown SiGe S/D features may be doped with boron; and the epitaxially grown Si epi S/D features may be doped with carbon to form Si:C source/drain features, phosphorous to form Si:P source/drain features, or both carbon and phosphorous to form SiCP source/drain features. In one embodiment, the S/D features are not in-situ doped. Instead, an implantation process (i.e., a junction implant process) is performed to dope the S/D features. One or more annealing processes may be performed to activate source/drain epitaxial feature. The annealing processes comprise rapid thermal annealing (RTA) and/or laser annealing processes.

Figure 2:
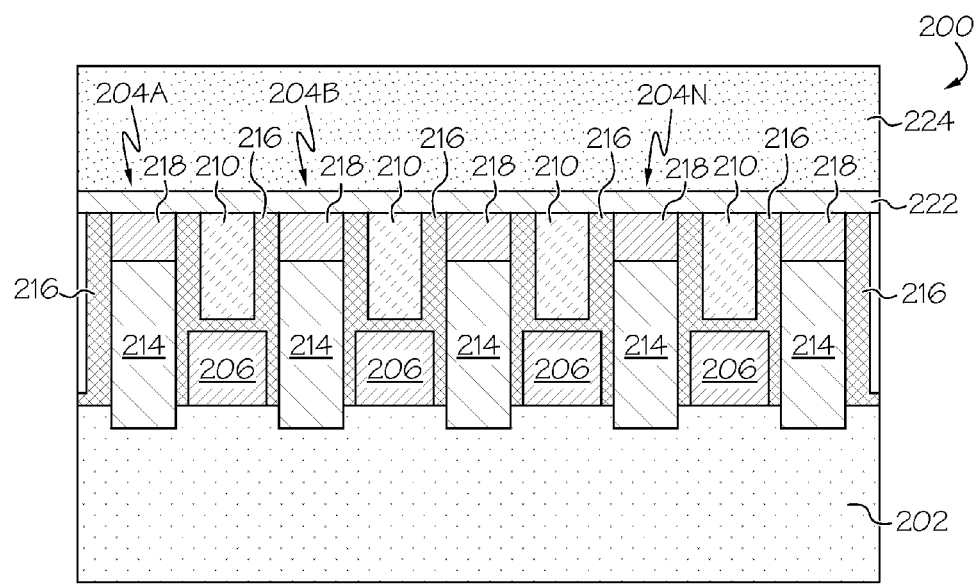
FIG. 2 shows a side cross-sectional view of the semiconductor device including an oxide and sacrificial layer formed over the set of gate structures according to illustrative embodiments.

FIG. 2 shows semiconductor device 200 including an oxide layer 222 and sacrificial layer 224 (e.g., an amorphous-silicon (a-Si), polysilicon, or an oxide) formed over set of gate structures 204A-N according to illustrative embodiments. Oxide layer 222 is a relatively thin layer that acts as an etch stop, as well as a planar surface for the deposition of sacrificial layer 224.

Figure 3:
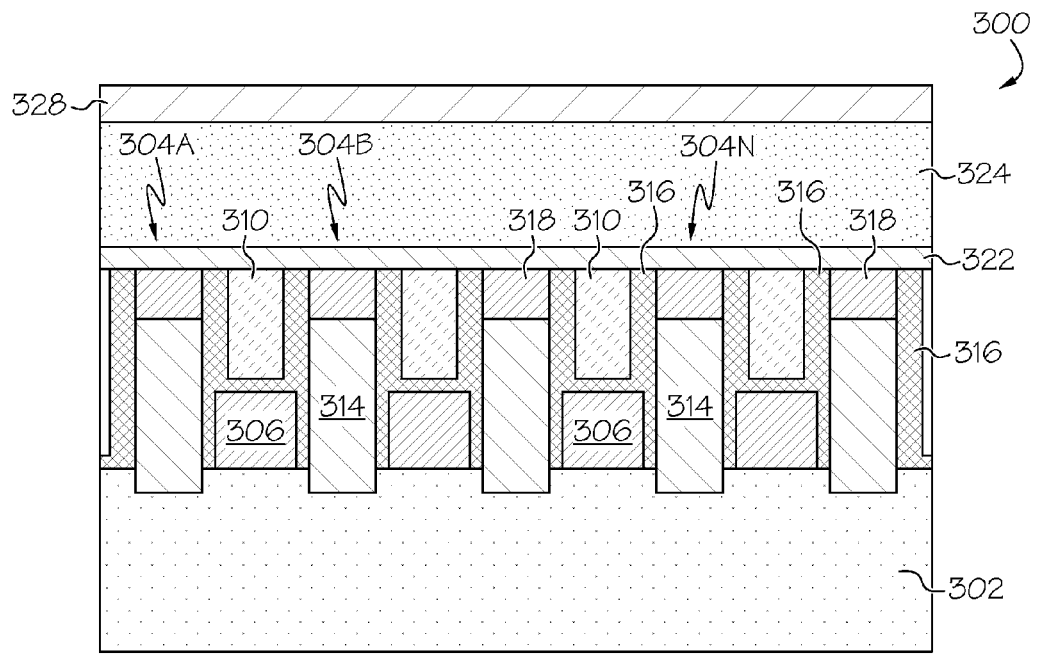
FIG. 3 shows a side cross-sectional view of another oxide layer formed over the sacrificial layer according to illustrative embodiments.
Figure 4:
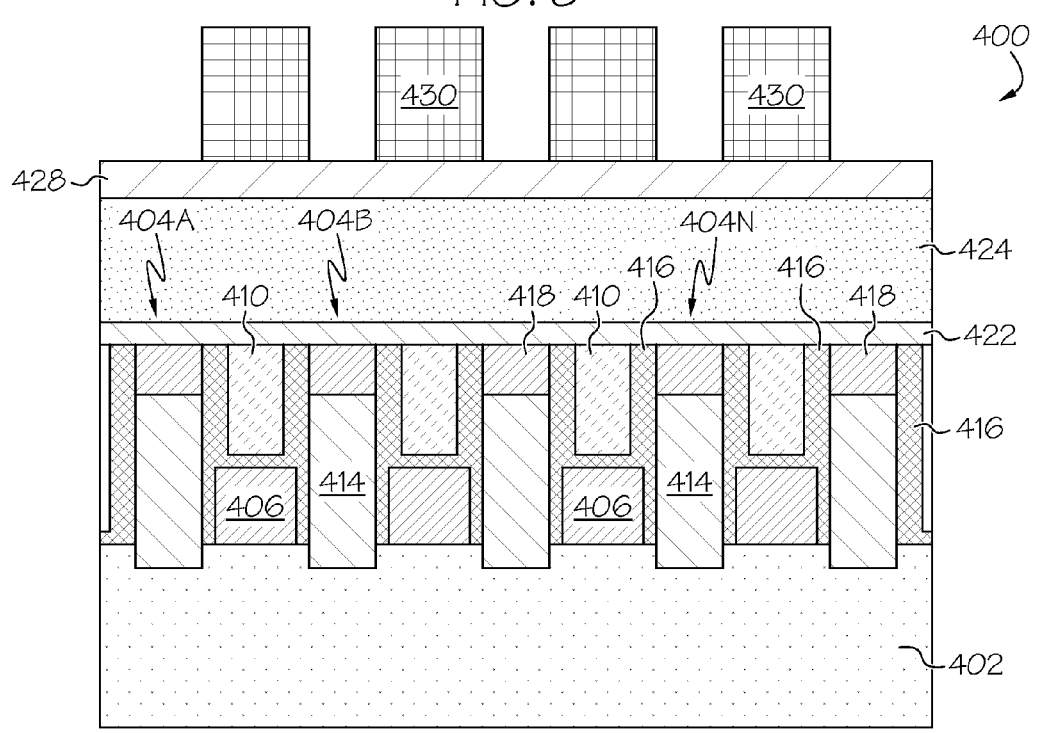
FIG. 4 shows a side cross-sectional view of a patterned lithography layer (or layers) formed over the semiconductor device according to illustrative embodiments.
Figure 5:
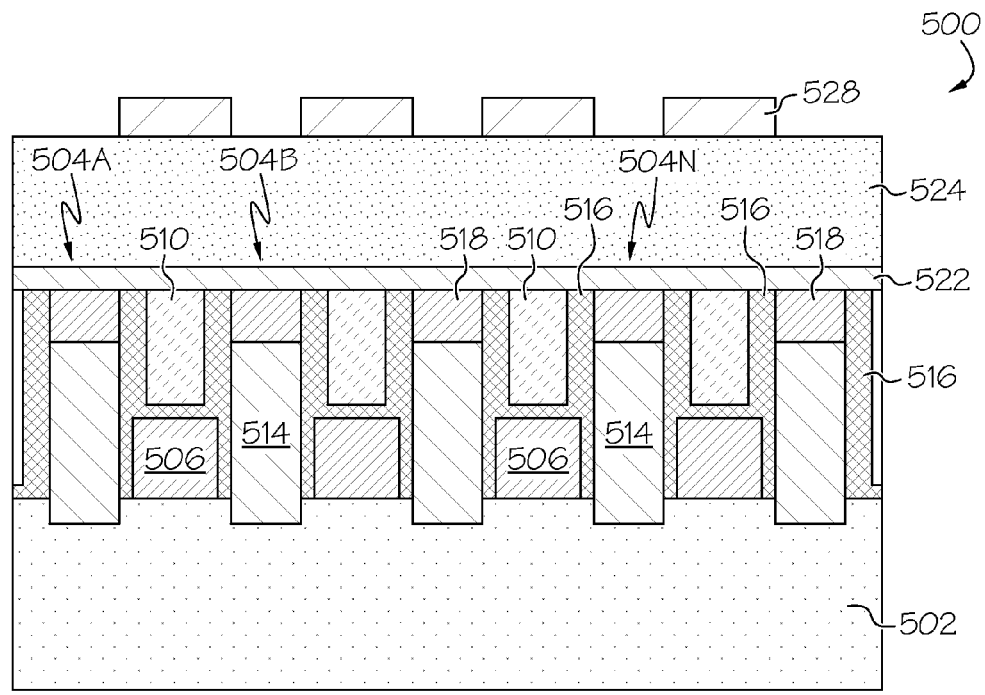
FIG. 5 shows a side cross-sectional view of the oxide layer patterned over the sacrificial layer according to illustrative embodiments.
Figure 6:
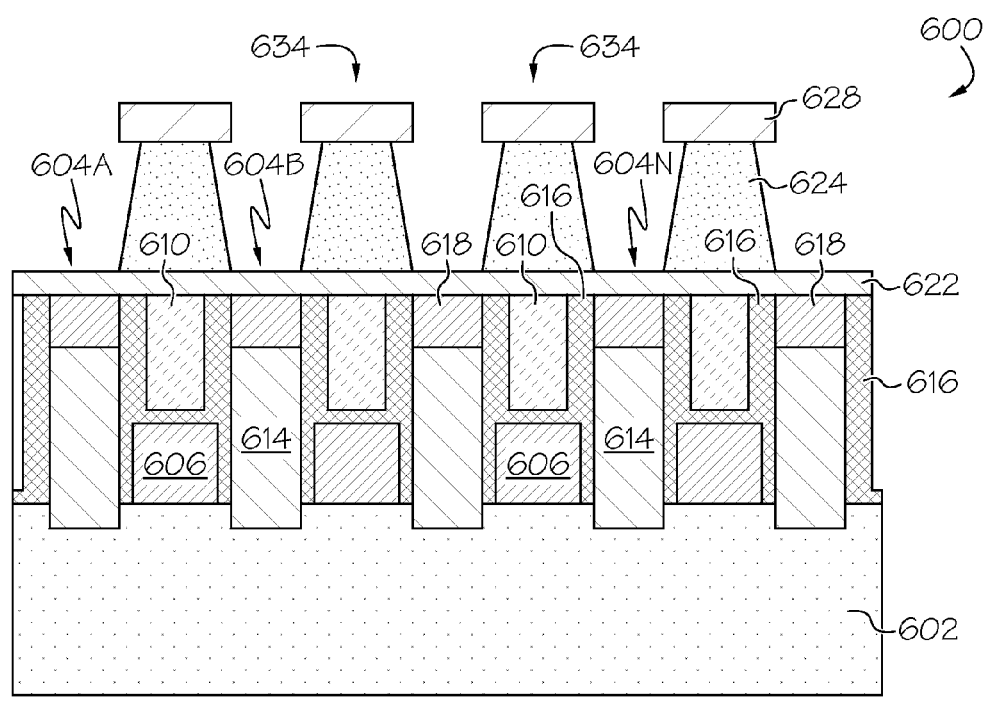
FIG. 6 shows a side cross-sectional view of a set of contact placeholders formed from the sacrificial layer following an etch process according to illustrative embodiments.

FIG. 3 shows semiconductor device 300 including another oxide layer 328 (i.e., a hard mask) formed over sacrificial layer 324 according to illustrative embodiments, while FIG. 4 shows semiconductor device 400 including a patterned lithography layer 430 formed over oxide layer 428 according to illustrative embodiments. Lithography layer 430 is used to pattern oxide layer 528, as shown in FIG. 5. Selected portions of oxide layer 528 are removed using any suitable approach, including one or more photolithography and etch processes. As shown, those portions of oxide layer 528 above each gate structure 504A-N are removed. This removal pattern is continued to sacrificial layer 624, as shown by semiconductor device 600 of FIG. 6. In this embodiment, sacrificial layer 624 is etched selective to oxide layer 622 to form a set of contact placeholders 634 positioned over each of set of fins 606. In one embodiment, each of contact placeholders 634 has a tapered profile, and is etched using a HBr-based Si etch, which is very selective to oxide.

Figure 7:
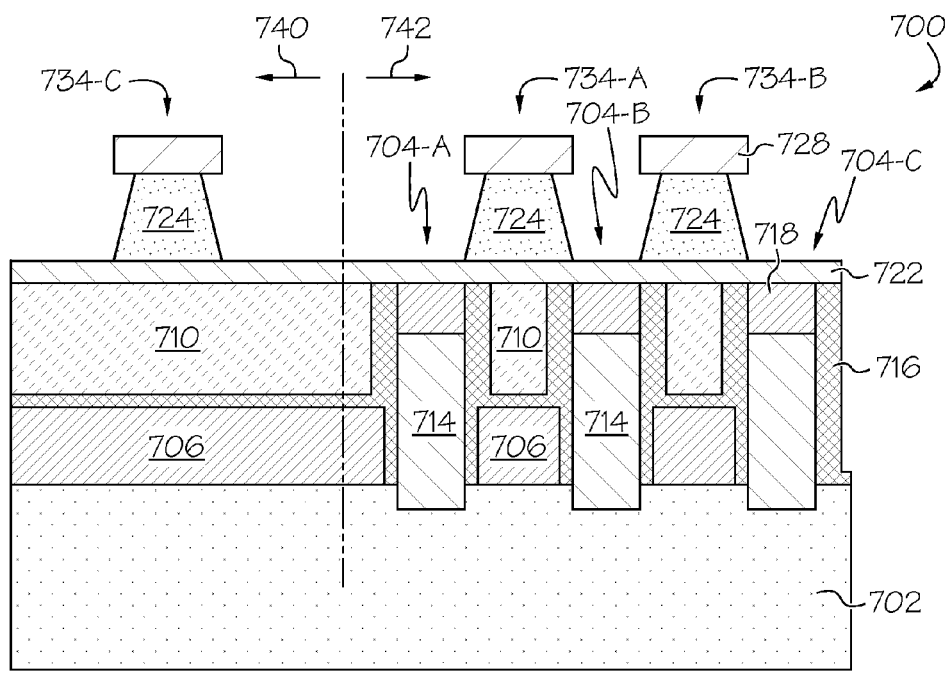
FIG. 7 shows a side cross-sectional view of the semiconductor device having a lower density area and a higher density area according to illustrative embodiments.

It will be appreciated that in some embodiments, the semiconductor device of the present invention includes multiple sections each having a different density. That is, one section may have multiple gate structures arranged in close proximity to one another, while another section contains fewer or no gate structures. This is demonstrated in FIG. 7, which shows a side cross-sectional view of semiconductor device 700 having a lower density area 740 adjacent a higher density area 742 according to an illustrative embodiment. As shown, higher density area 742 contains set of gate structures 704A-C and set of contact placeholders 734A-B, while lower density area 740 includes no gate structures and contact placeholder 734C.

Figure 8:
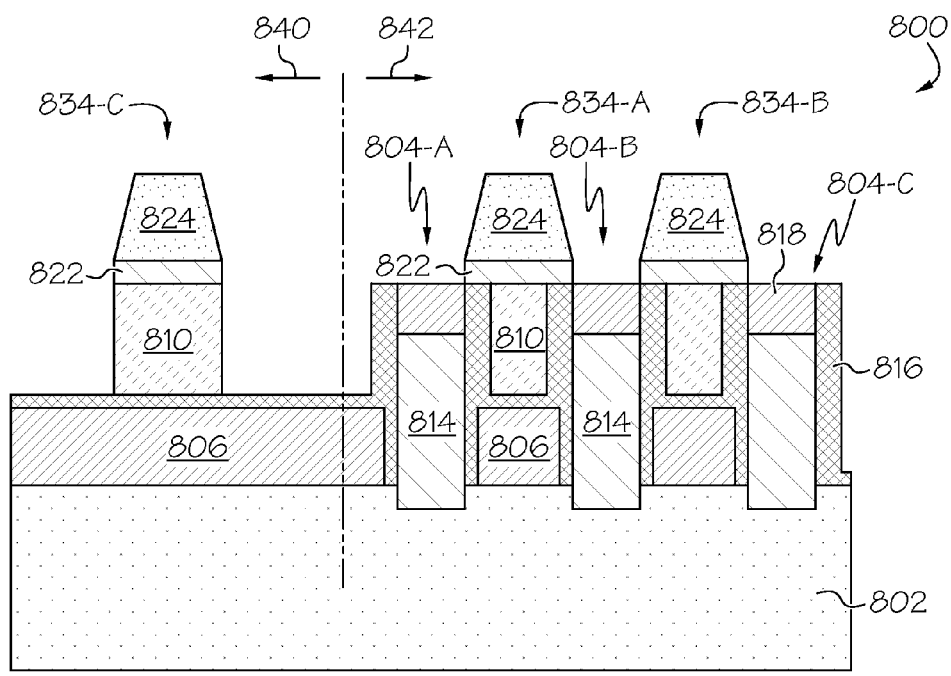
FIG. 8 shows a side cross-sectional view of the semiconductor device following removal of oxide remaining uncovered by the contact placeholders.

Next, an oxide etch is performed, as shown by semiconductor 800 of FIG. 8. In this embodiment, oxide (e.g., oxide 822 and oxide 810) remaining covered by contact placeholders 834A-C remains following the oxide etch.

Figure 9:
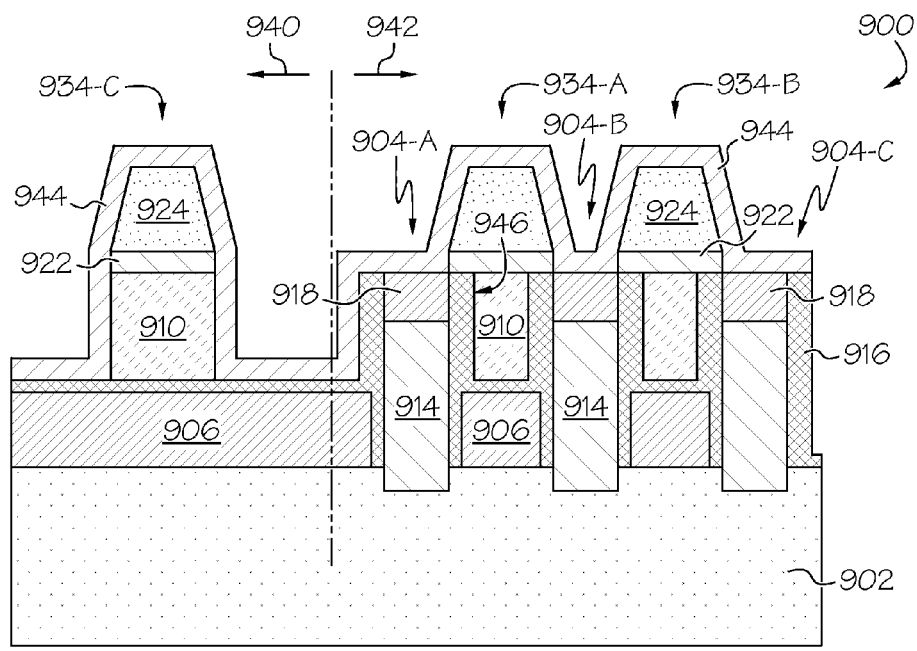
FIG. 9 shows a side cross-sectional view of the semiconductor device following a deposition of a first nitride layer according to illustrative embodiments.

FIG. 9 shows semiconductor device 900 following deposition of a first nitride layer 944 according to illustrative embodiments. Here, first nitride layer 944 is a conformal nitride, and serves as a barrier to Diluted HydroFluoric acid (dHF) used during a subsequent oxide strip. It will be appreciated that no extra spacer thickness is added in the critical dimension (CD) contact area 946 along the sidewalls of gate structures 904.

Figure 10:
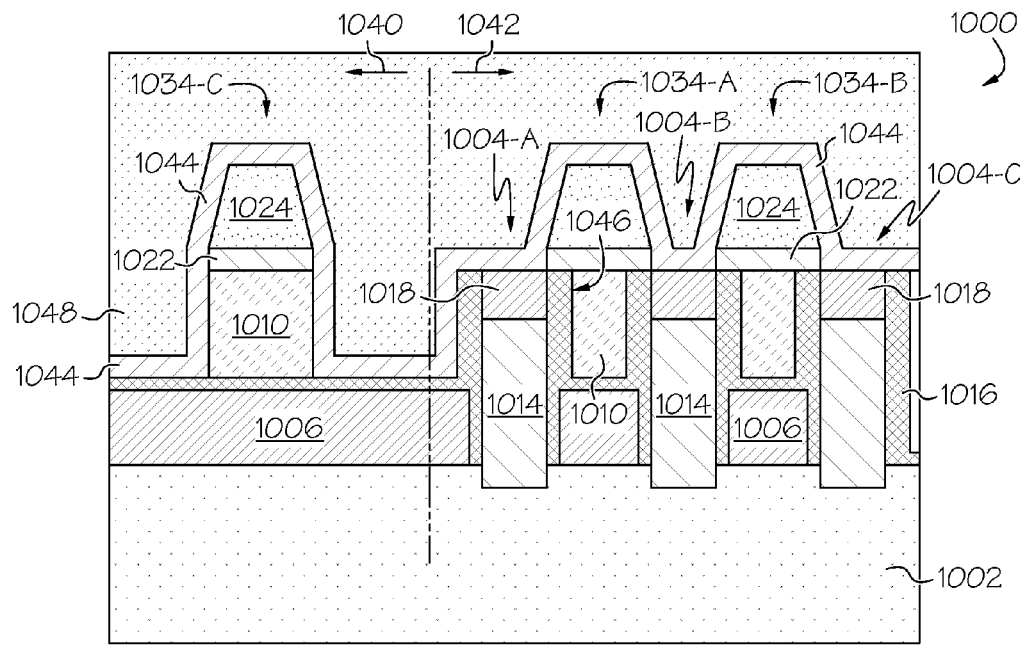
FIG. 10 shows a side cross-sectional view of the semiconductor device following a deposition of an oxide fill according to illustrative embodiments.
Figure 11:
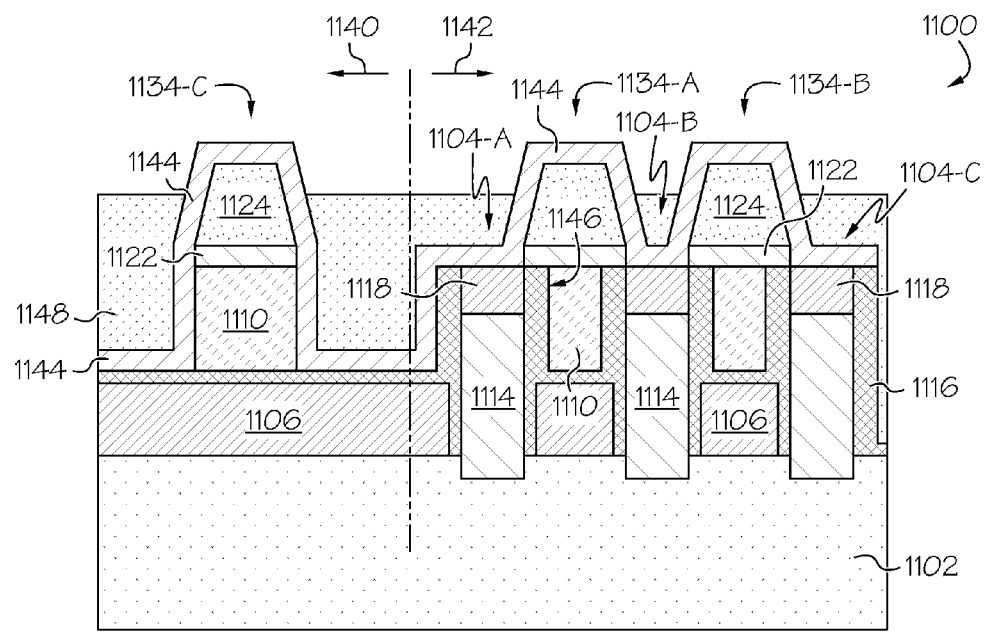
FIG. 11 shows a side cross-sectional view of the semiconductor device following a planarization to the oxide fill and recess etch according to illustrative embodiments.

FIG. 10 shows semiconductor device 1000 following deposition of an interlayer fill material 1048, e.g., a flowable chemical vapor deposited (FCVD) insulator such as silicon oxide, which is then recessed, as shown in FIG. 11. In this embodiment, interlayer fill material 1148 is etched back using a RIE process.

Figure 12:
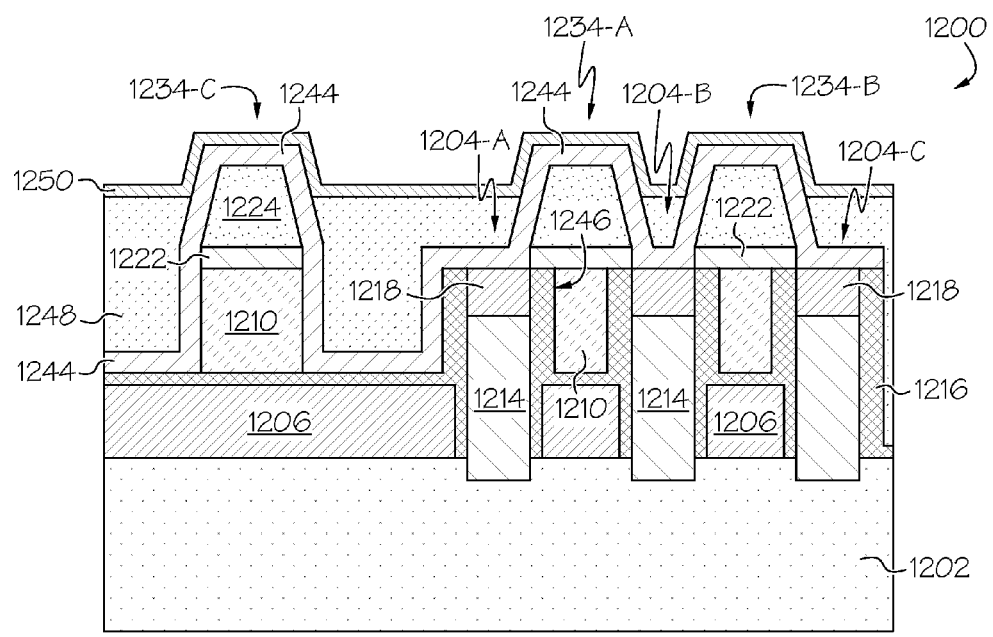
FIG. 12 shows a side cross-sectional view of the semiconductor device following deposition of a second nitride layer according to illustrative embodiments.
Figure 13:
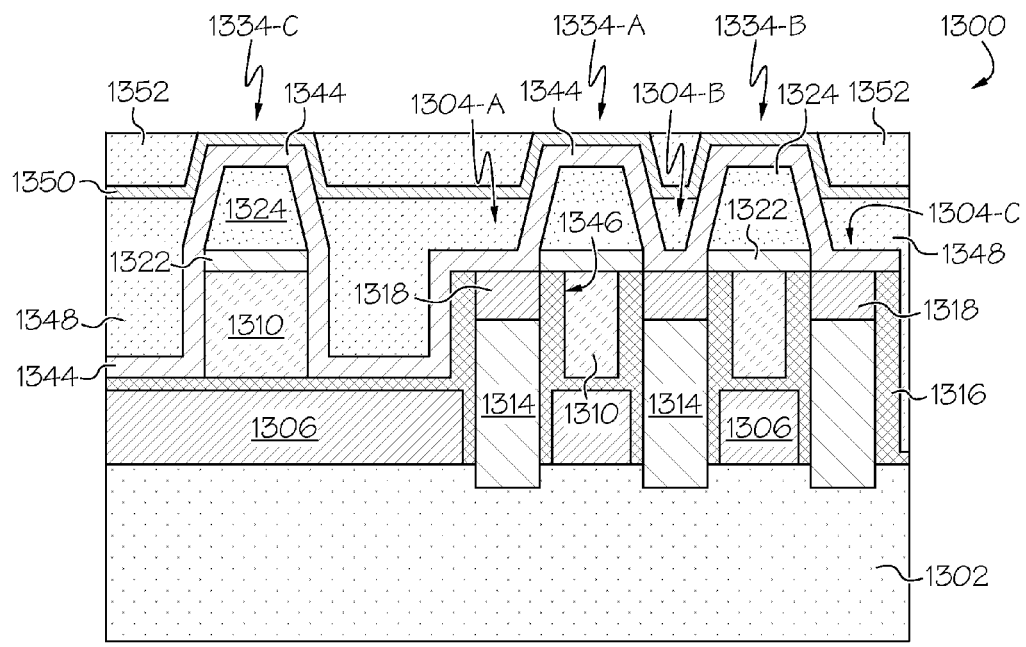
FIG. 13 shows a side cross-sectional view of the semiconductor device following deposition of another oxide fill according to illustrative embodiments.

Next, as shown by semiconductor device 1200 of FIG. 12, a second nitride layer 1250 is deposited over first nitride layer 1244, followed by deposition and etch back of another fill material 1352 (e.g., flowable silicon oxide), as shown in FIG. 13.

Figure 14:
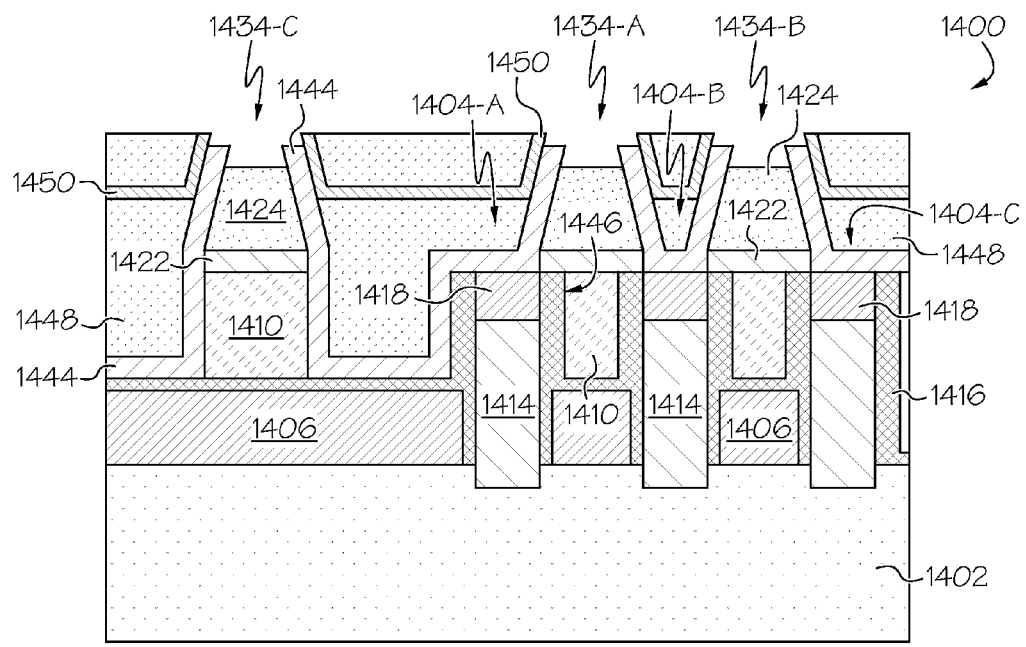
FIG. 14 shows a side cross-sectional view of the semiconductor device following an etch through the first and second nitride layers to expose the sacrificial layer of the contact placeholders according to illustrative embodiments.
Figure 15:
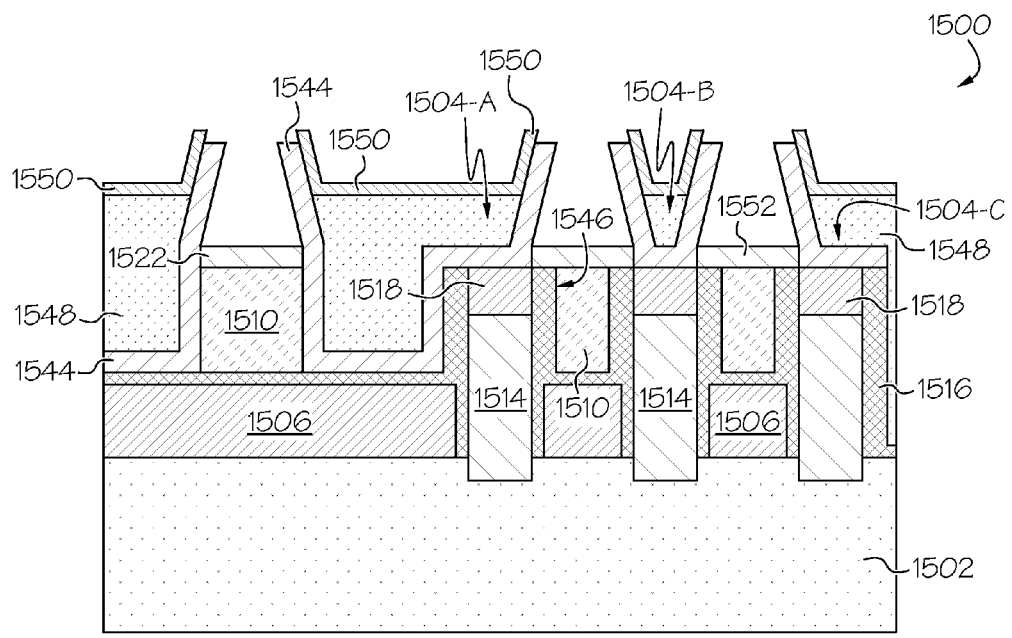
FIG. 15 shows a side cross-sectional view of the semiconductor device following removal of the sacrificial oxide layer of the contact placeholders according to illustrative embodiments.

FIG. 14 shows semiconductor device 1400 following an etch through first nitride layer 1444 and second nitride layer 1450 to expose sacrificial layer 1424 of contact placeholders 1434 according to illustrative embodiments. Here, first and second nitride layers 1444 and 1450 are opened using a RIE process. Sacrificial layer 1424 is then removed, e.g., using an anisotropic wet etch process with tetramethylammonium hydroxide (TMAH), resulting in semiconductor device 1500 shown in FIG. 15.

Figure 16:
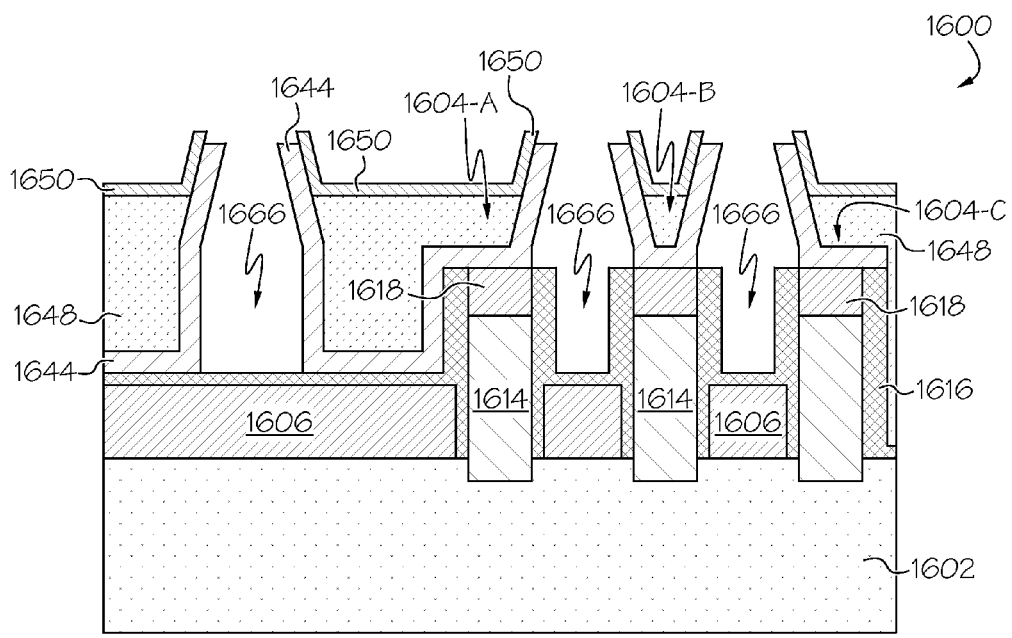
FIG. 16 shows a side cross-sectional view of the semiconductor device following removal of oxide over a set of fins formed from the substrate according to illustrative embodiments.

FIG. 16 shows semiconductor device 1600 following removal of the oxide over second nitride layer 1650 and over set of fins 1606. In one embodiment, the oxide is removed using a diluted hydrofluoric acid (DHF) treatment or a vapor hydrofluoric acid (VHF) treatment for a suitable time to form a set of S/D openings 1666.

Figure 17:
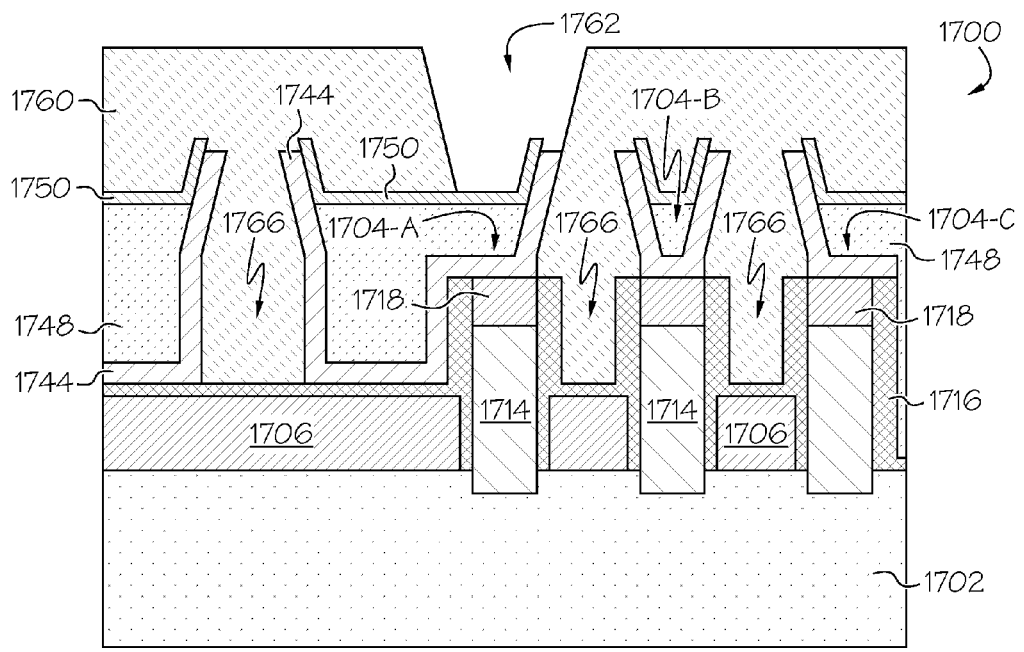
FIG. 17 shows a side cross-sectional view of the semiconductor device following formation of a lithography masking structure according to illustrative embodiments.
Figure 18:
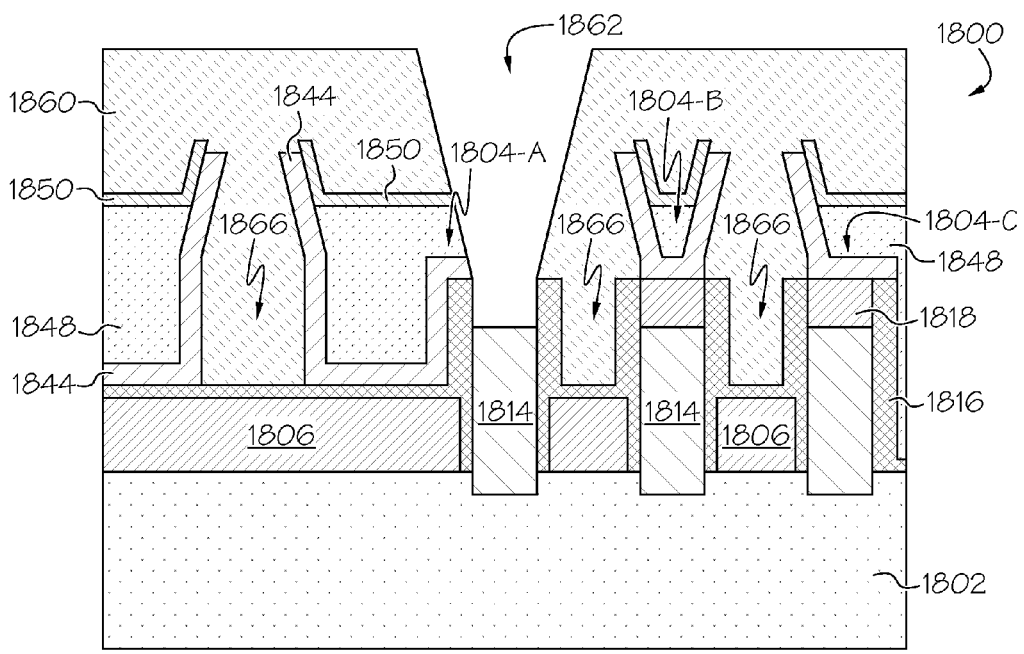
FIG. 18 shows a side cross-sectional view of the semiconductor device following an etch to the first and second nitride layers within an opening formed by the lithography masking structure according to illustrative embodiments.

FIG. 17 shows semiconductor device 1700 following formation of a lithography masking structure 1760 according to illustrative embodiments. As shown, an opening 1762 is formed in lithography masking structure 1760 over gate structure 1704-A. Opening 1862 is then extended down to gate metal 1814 of gate structure 1804, as shown in FIG. 18, to form a gate contact opening. Here, first nitride layer 1844 and second nitride layer 1850 are etched through, along with oxide 1848, to form opening 1862. Removing the nitride in this area enables a subsequent contact stitch with an adjacent S/D contact to be formed after metallization.

Figure 19:
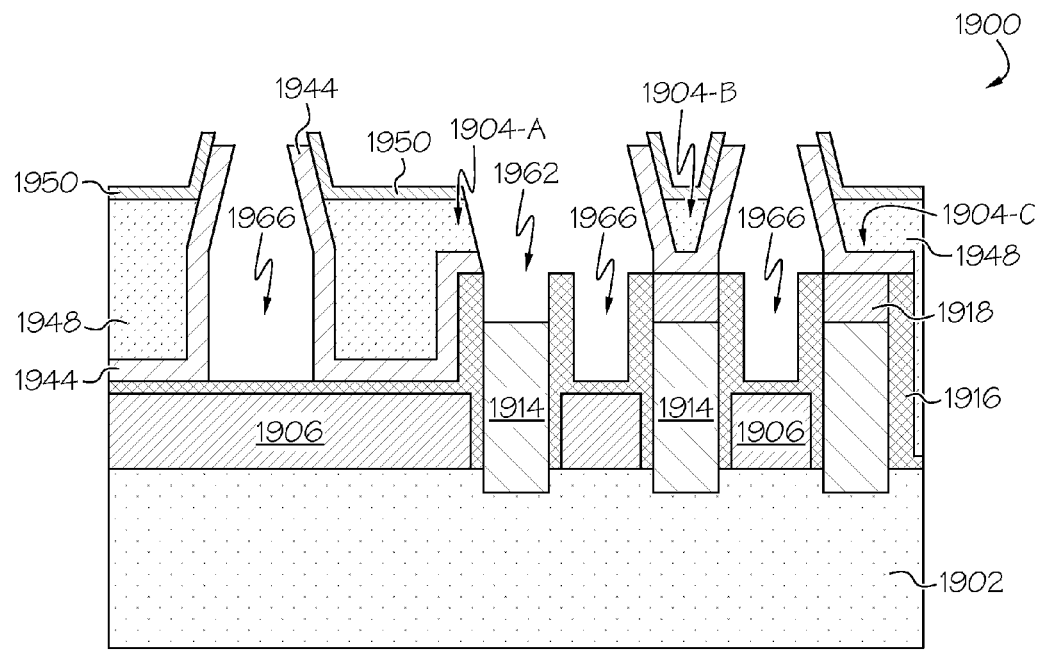
FIG. 19 shows a side cross-sectional view of the semiconductor device following removal of the lithography masking structure according to illustrative embodiments.
Figure 20:
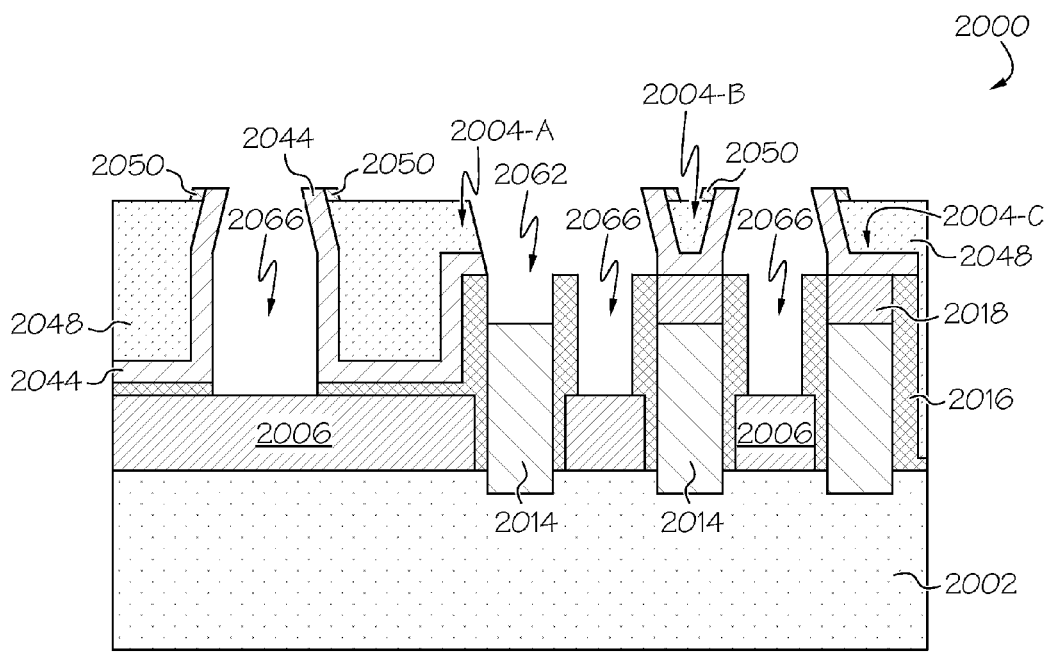
FIG. 20 shows a side cross-sectional view of the semiconductor device following an etch to the first and second nitride layers over the oxide fill according to illustrative embodiments.

Next, the lithography masking structure is removed from semiconductor device 1900, as shown by FIG. 19, followed by an etch of the nitride above oxide 2048 and remaining CESL nitride atop set of fins 2006, as shown by FIG. 20.

Figure 21:
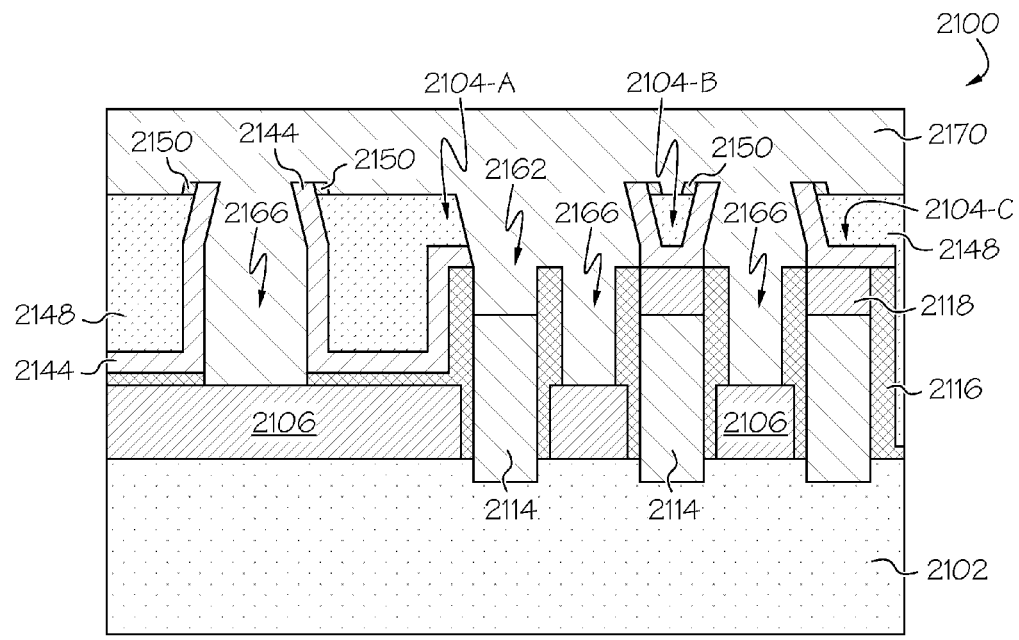
FIG. 21 shows a side cross-sectional view of the semiconductor device following deposition of a metal to form a gate contact and a set of S/D contacts according to illustrative embodiments.
Figure 22:
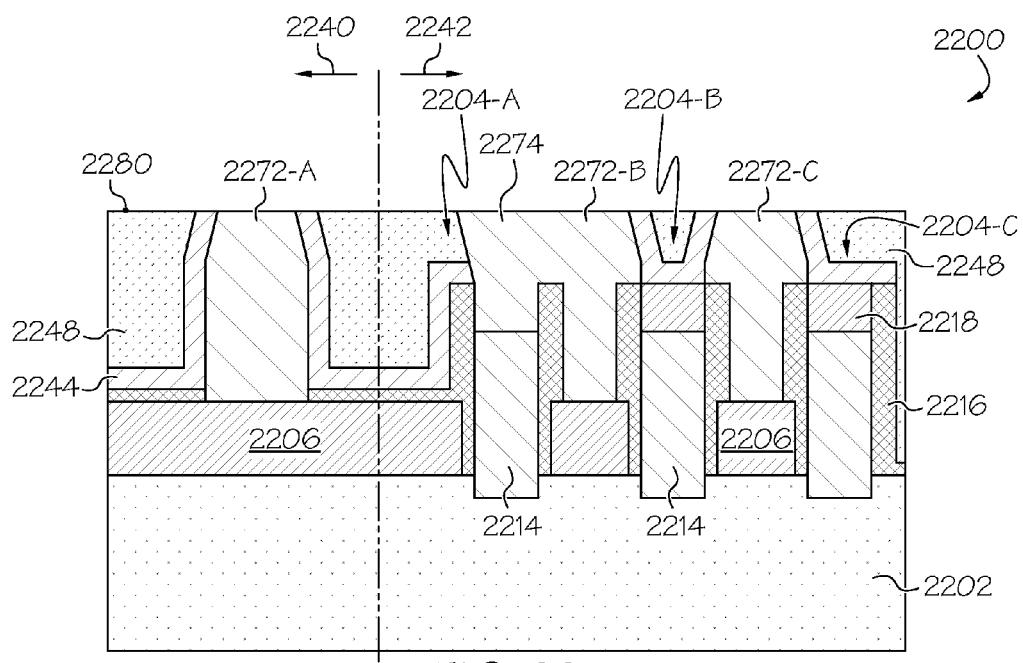
FIG. 22 shows a side cross-sectional view of the semiconductor device following a planarization to the metal according to illustrative embodiments.

FIG. 21 shows semiconductor device 2100 following deposition of a metal material 2170, which is planarized as shown by semiconductor device 2200 of FIG. 22. Metal material 2170 may be formed of a thin liner of Ti/TiN (e.g., with thickness in the range of 1 to 4 nm) and a metal fill consisting of CVD W or Co, for instance.

As shown in FIG. 22, semiconductor device 2200 includes a set of S/D contacts 2272A-C and a gate contact 2274, wherein the gate contact 2274 and at least one of S/D contacts 2272 (i.e., S/D contact 2272-B) are merged. In this embodiment, S/D contact 2272-A is formed in lower density area 2240, and the merged gate contact 2274-B and S/D contact 2272 are formed in higher density area 2242. However, this is not is not dispositive, and is shown for exemplary purposes only. Furthermore, it will be appreciated that the shape/profile of S/D contacts is selected to provide better coverage of fins 2206, while limiting the risk of bridging at the top. To do so, an inversed tapered shape has been patterned, wherein a width of the S/D contacts narrows towards a top surface 2280 of fillable oxide 2248.

Figure 23:
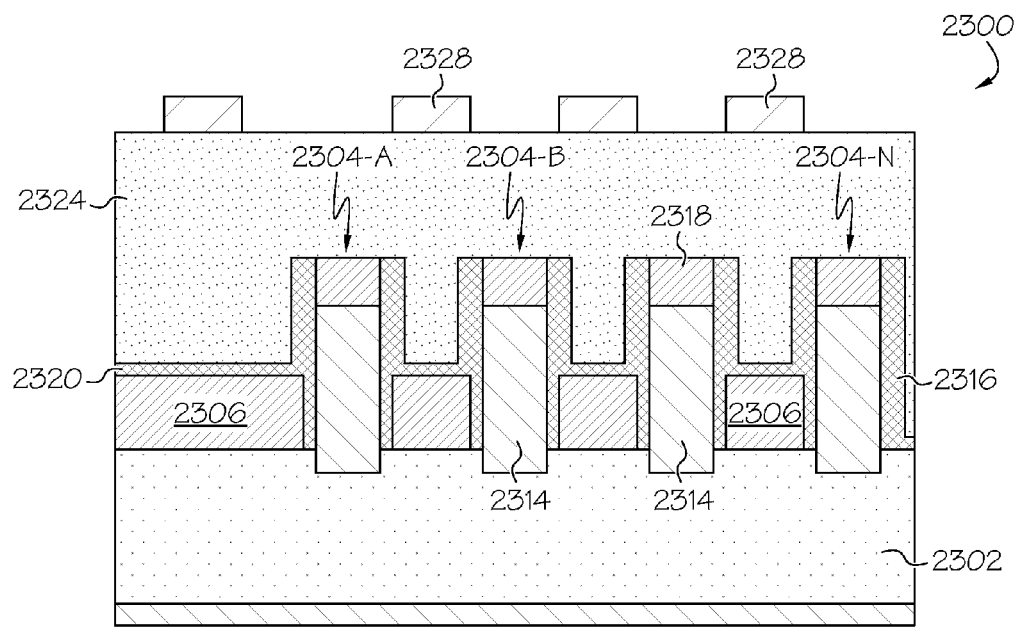
FIG. 23 shows a side cross-sectional view of a semiconductor device following a patterning of a nitride layer over a sacrificial layer according to illustrative embodiments.

Turning now to FIG. 23 another embodiment for forming a semiconductor device (e.g., a FinFET) will be shown and described. Semiconductor device 2300 includes a substrate 2302 and a set of gate structures 2304A-N (e.g., replacement metal gates (RMG)) formed over substrate 2302. Device 2300 further comprises a set of fins 2306 formed from substrate 2302. Gate structures 2304A-N include a recessed gate dielectric and metal stack 2314 (e.g., HfO2 as gate dielectric, TiN and W as gate metal), a spacer protection layer 2316 (e.g., SiN or SiOCN low k), and a capping layer 2318 (e.g., SiN or SiOCN low k). Capping layer 2318 is formed by recessing with etch the metal gate then depositing SiN followed by chemical mechanical planarization (CMP).

Figure 24:
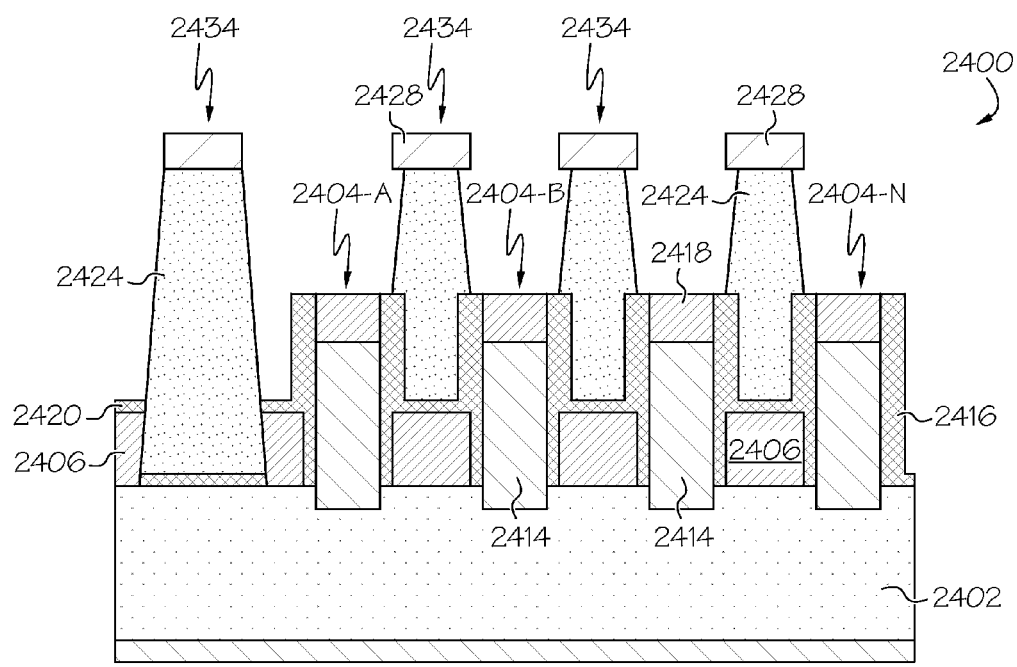
FIG. 24 shows a side cross-sectional view of the semiconductor device following the formation of a set of contact placeholders according to illustrative embodiments.

Semiconductor device 2300 further comprises a sacrificial layer 2324 (e.g., a-Si formed over each gate structure 2304A-N, and a hard mask 2328 (e.g., nitride) patterned over sacrificial layer 2324. Hard mask 2328 is used to pattern sacrificial layer 2324, as shown in FIG. 24. Selected portions of amorphous silicon sacrificial layer 2424 are removed using any suitable approach, including one or more photolithography and etch processes, to form a set of contact placeholders 2434 positioned over set of fins 2406. Each of contact placeholders 2434 has a tapered profile, and may be etched using a HBr-based Si etch.

Figure 25:
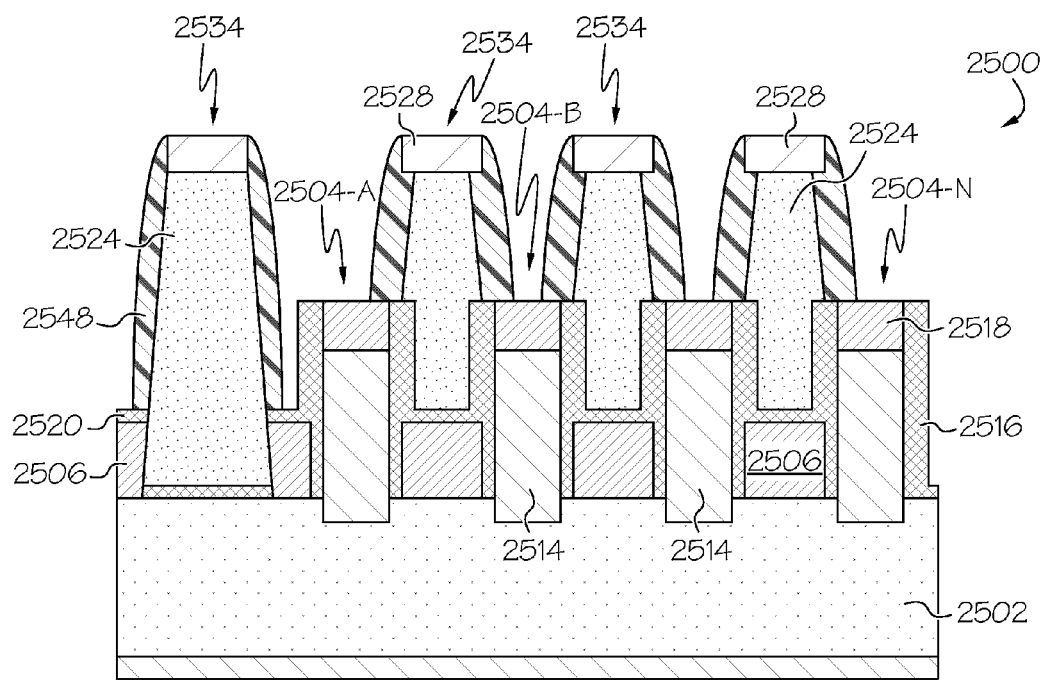
FIG. 25 shows a side cross-sectional view of the semiconductor device including a set of spacers formed along the sidewalls of each of the set of contact placeholders according to illustrative embodiments.
Figure 26:
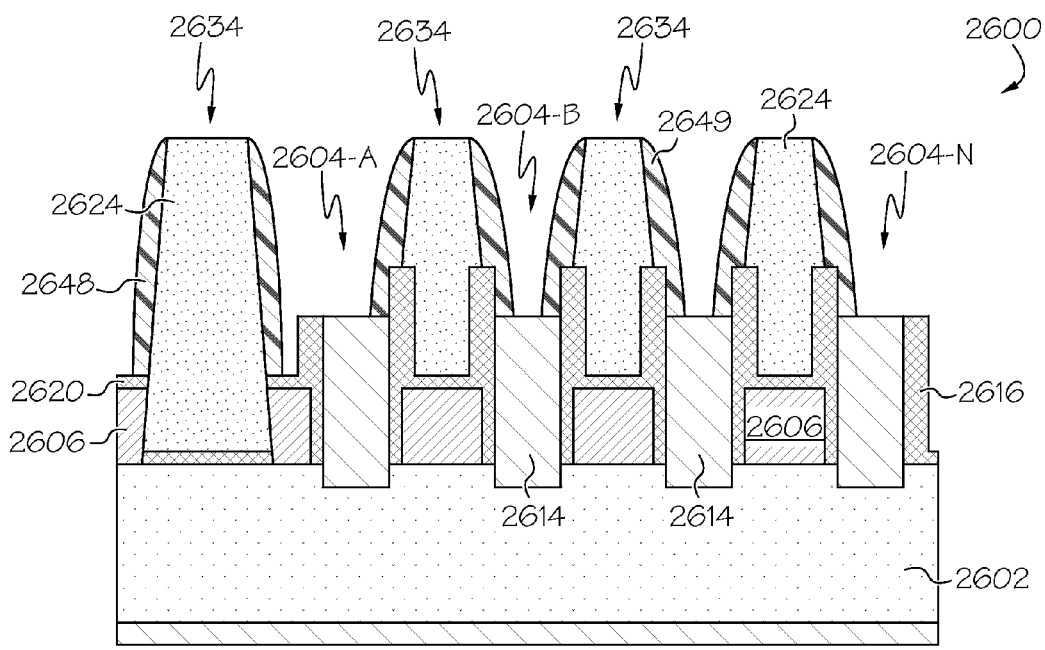
FIG. 26 shows a side cross-sectional view of the semiconductor device following the removal of the nitride layer atop each of the set of contact placeholders according to illustrative embodiments.

A set of nitride spacers 2549 are then formed along the side all of each contact placeholder 2534, as shown in FIG. 25, and hard mask 2528 and capping layer 2518 are then removed, resulting in the structure shown by semiconductor device 2600 shown in FIG. 26. As depicted, nitride is removed from atop sacrificial layer 2624 and gate metal 2614 without removing a majority of set of nitride spacers 2649 along the sidewalls of each contact placeholder 2634 according to the expected result of a conventional spacer process sequence of deposition and anisotropic reactive ion etch, with significant over-etch in this case.

Figure 27:
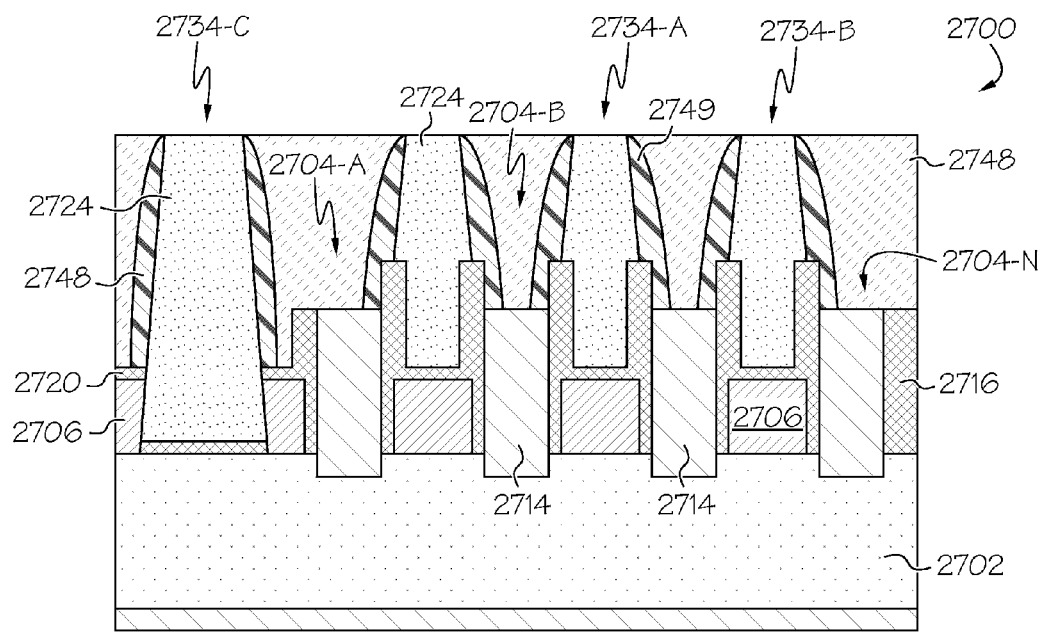
FIG. 27 shows a side cross-sectional view of the semiconductor device following the formation of an oxide fill according to illustrative embodiments.

FIG. 27 shows semiconductor device 2700 following deposition and etching of a interlayer fill material 2748, e.g., a flowable chemical vapor deposited (FCVD) insulator such as silicon oxide. In this embodiment, interlayer fill material 2748 is etched back using a RIE process.

Figure 28:
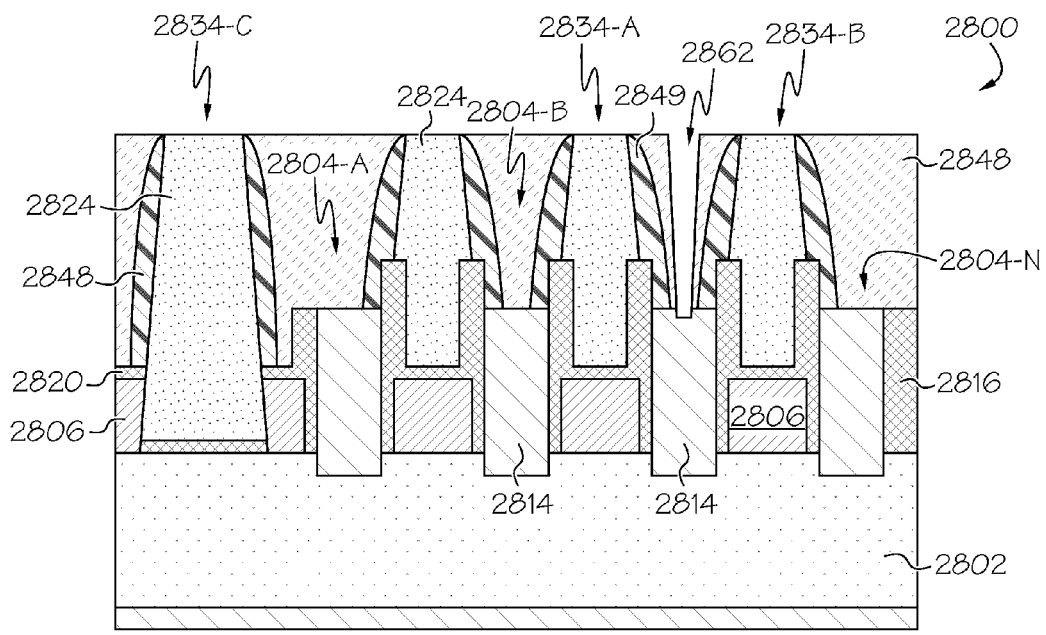
FIG. 28 shows a side cross-sectional view of the semiconductor device following the formation of a gate contact opening in the oxide fill according to illustrative embodiments.

FIG. 28 shows semiconductor device 2800 following formation of a gate contact opening 2862. In this embodiment, the oxide of interlayer fill material 2748 is etched between contact placeholders 2834A-B to form self-aligned gate contact opening 2862. As shown, a layer of oxide and nitride (e.g., from nitride spacer 2849) remains between gate contact opening 2862 and etch of contact placeholders 2834A-B. The contact is described as self-aligned since even in the case of poor overlay during the lithographic process, the nitride spacers 2849 around placeholders 2834A and 2834B, being impervious to the selective oxide etch, will therefore remain as an electric isolator between opening 2862 and 2834A-B.

Figure 29:
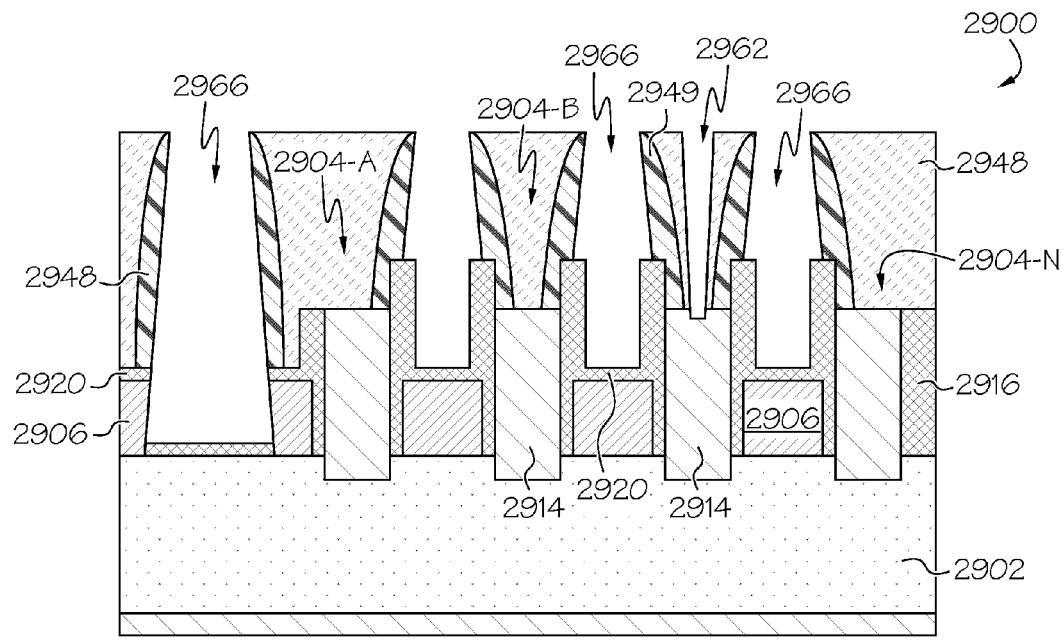
FIG. 29 shows a side cross-sectional view of the semiconductor device following removal of the sacrificial layer from each of the set of contact placeholders according to illustrative embodiments.
Figure 30:
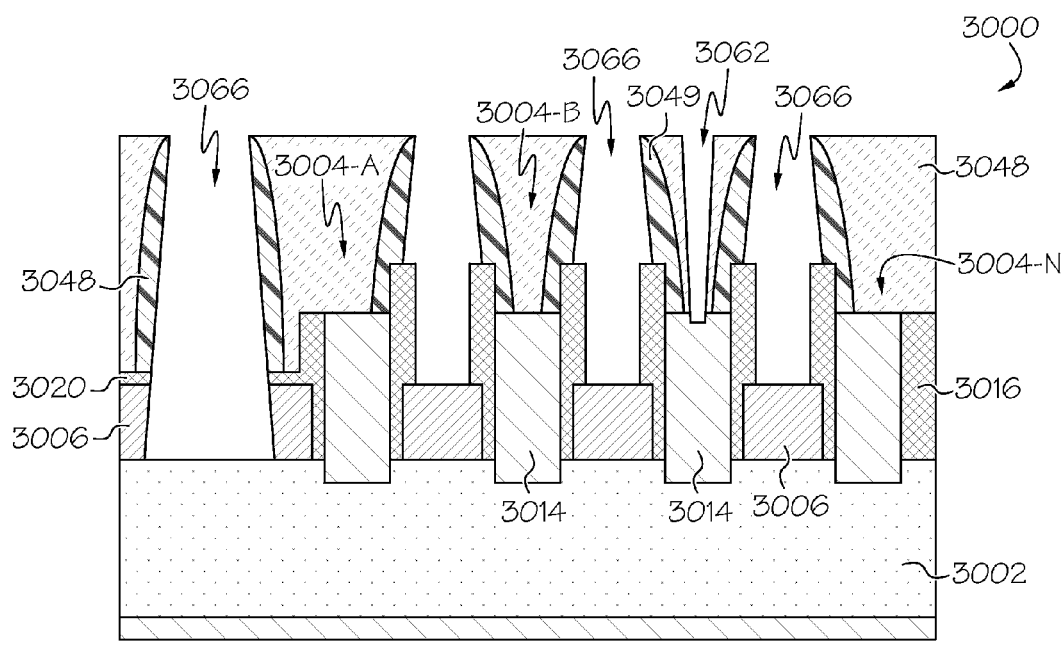
FIG. 30 shows a side cross-sectional view of the semiconductor device following removal of a nitride layer formed atop each of a set of fins formed from the substrate according to illustrative embodiments.

Next, the sacrificial layer is removed, as shown by semiconductor device 2900 in FIG. 29. In one embodiment, the sacrificial layer is removed, using an anisotropic etch process (with TMAH), from each of the set of contact placeholders to form a set of S/D contact openings 2966. This is followed by an etch to nitride layer 2920 atop fins 2906, resulting in semiconductor device 3000 shown by FIG. 30.

Figure 31:
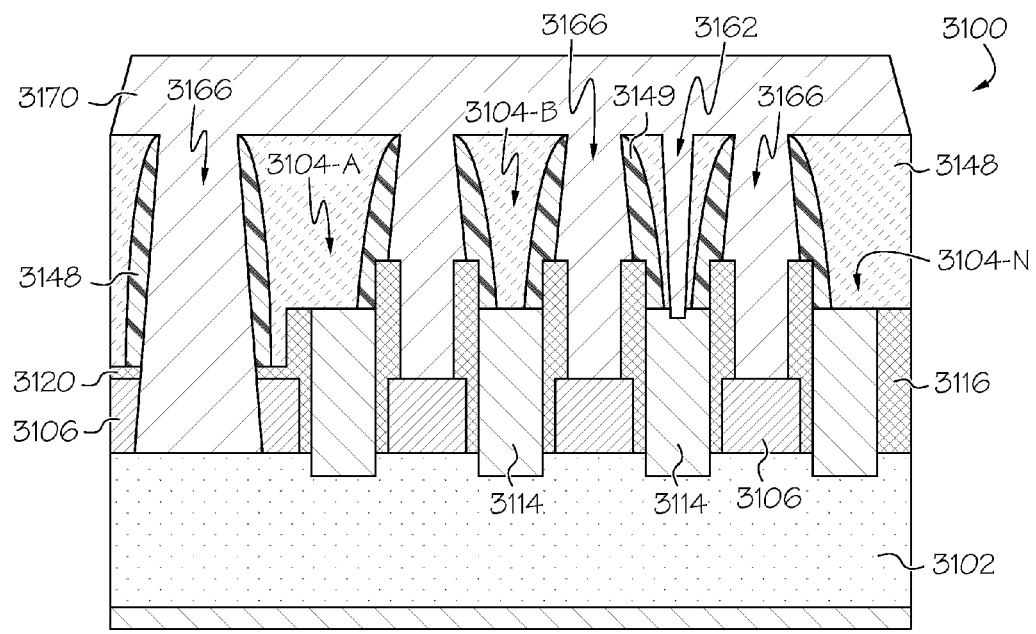
FIG. 31 shows a side cross-sectional view of the semiconductor device following deposition of a metal to form a gate contact and a set of S/D contacts according to illustrative embodiments.
Figure 32:
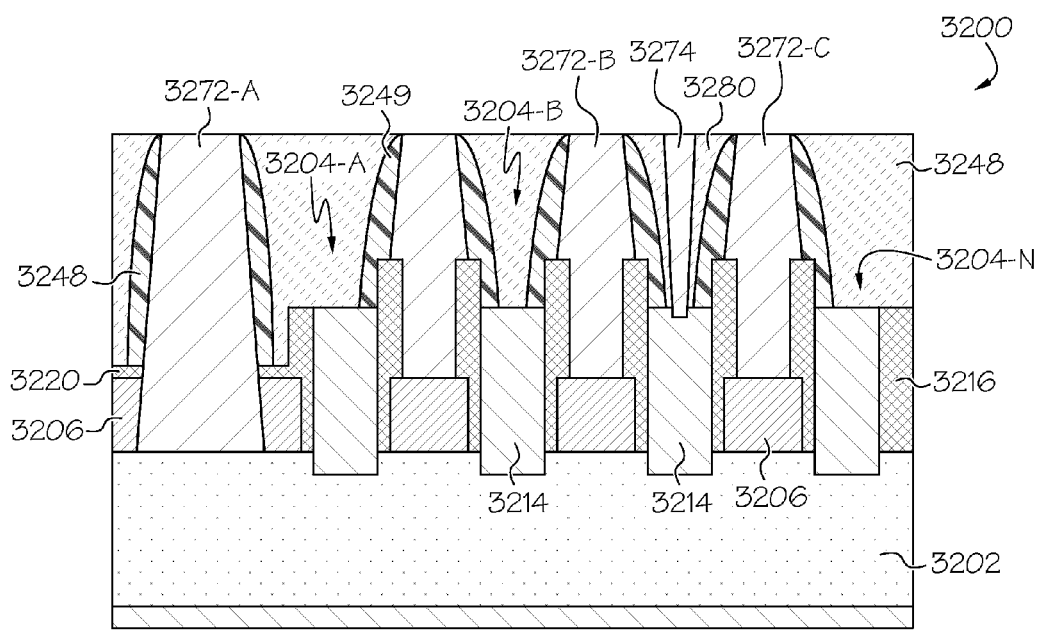
FIG. 32 shows a side cross-sectional view of the semiconductor device following a planarization to the metal according to illustrative embodiments.

FIG. 31 shows semiconductor device 3100 following deposition of a metal material 3170, which is planarized as shown by semiconductor device 3200 of FIG. 32. Metal material 3170 may be formed of a thin liner of Ti/TiN (e.g., with a thickness in the range of 1 to 4 nm) and a metal fill consisting of CVD W or Co, for instance.

As shown in FIG. 32, semiconductor device 3200 includes a set of S/D contacts 3272 and a gate contact 3274, wherein the gate contact 3274 is separated from each of S/D contacts 3272B-C by a section 3280 of oxide and nitride (e.g., from nitride spacer 3249). It will be appreciated that this structure and approach is compatible with a source-drain contact replacement scheme and, in addition, provides a way to self-align gate contact 3274 so that the risk of shorting gate contact 3274 and S/D contacts 3272B-C is reduced by the inclusion of the nitride barrier, thus improving yield.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs. PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for forming gate and S/D contacts. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a FinFET semiconductor device, the method comprising:
   forming a set of gate structures over a substrate;
   patterning a sacrificial layer to form a set of contact placeholders over a set of fins formed from the substrate;
   forming a barrier layer over the set of contact placeholders;
   depositing a fill material over the barrier layer;
   etching through the barrier layer atop each of the set of contact placeholders;
   etching a hard mask from the set of contact placeholders to expose the sacrificial layer;
   removing the sacrificial layer of the contact placeholders;
   removing an oxide over the set of fins to form the set of SD contact openings in the semiconductor device;
   patterning a lithography masking structure over the semiconductor device to form the gate contact opening over the at least one of the set of gate structures;
   forming a gate contact opening by etching an oxide over at least one of the set of gate structures;
   removing, selective to a metal stack of the at least one of the set of gate structures, the barrier layer and an interlayer fill material within the gate contact opening;
   removing the lithography masking structure from over the semiconductor device; forming a set of source/drain (S/D) contact openings in the semiconductor device by removing the sacrificial layer from atop the set of fins; and
   depositing a metal material over the semiconductor device to form a gate contact within the gate contact opening and a set of S/D contacts within the set of S/D contact openings.

2. The method according to claim 1, the forming the barrier layer comprising:
   forming a first nitride layer over the set of gate structures and the set of contact placeholders;
   forming the interlayer fill material over the first nitride layer; and
   forming a second nitride layer over the interlayer fill material.

3. The method according to claim 1, wherein the sacrificial layer is removed using an anisotropic etch process with tetramethylammonium hydroxide (TMAH), and wherein the oxide over the set of fins is removed using Diluted Hydrofluoric acid (dHF).

4. The method according to claim 1, further comprising:
   providing an oxide between each of the set of gates;
   forming a first oxide layer over each of the set of gates and over the oxide between each of the set of gates, wherein the sacrificial layer is formed over the first oxide layer;
   forming a second oxide layer over the sacrificial layer;
   patterning the second oxide layer to form the set of contact placeholders; and
   removing the first oxide layer and the second oxide layer remaining exposed following formation of the set of contact placeholders.

5. The method according to claim 1, the set of contact placeholders comprising at least one of the following: amorphous-silicon, polysilicon, and oxide.

6. The method according to claim 1, further comprising:
   providing nitride over the set of contact placeholders to form a barrier layer;
   depositing a fill material over the semiconductor device following the etching of the barrier layer from the set of contact placeholders, leaving a nitride spacer; and
   patterning the fill material between the set of contact placeholders to form the gate contact opening, wherein a layer of nitride remains between the gate contact opening and the set of contact placeholders.

7. The method according to claim 6, the forming the set of S/D contact openings comprising removing the sacrificial layer using an anisotropic etch process with tetramethylammonium hydroxide (TMAH).

8. A method for forming self-aligned contacts in a FinFET semiconductor device, the method comprising:
   forming a set of gate structures over a substrate;
   patterning a sacrificial layer to form a set of contact placeholders over a set of fins formed from the substrate;
   forming the barrier layer over the set of contact placeholders;
   depositing a fill material over the barrier layer;
   etching through the barrier layer atop each of the set of contact placeholders;
   etching a hard mask from the set of contact placeholders to expose the sacrificial layer;
   removing the sacrificial layer of the contact placeholders;
   forming a gate contact opening by etching an oxide over at least one of the set of gate structures;
   removing an oxide over the set of fins to form the set of S/D contact openings in the semiconductor device;
   forming a set of source/drain (S/D) contact openings in the semiconductor device by removing the sacrificial layer from atop the set of fins;
   depositing a metal material over the semiconductor device to form a gate contact within the gate contact opening and a set of SD contacts within the set of SD contact openings;
   patterning a lithography masking structure over the semiconductor device to form the gate contact opening over the at least one of the set of gate structures;
   removing, selective to a metal stack of the at least one of the set of gate structures, the barrier layer and an interlayer fill material within the gate contact opening; and removing the lithography masking structure from over the semiconductor device.

9. The method according to claim 8, the forming the barrier layer comprising:
forming a first nitride layer over the set of gate strictures and the set of contact placeholders;
forming the interlayer fill material over the first layer of nitride; and
forming a second nitride layer over the interlayer fill material.

10. The method according to claim 9, wherein the sacrificial layer is removed using an anisotropic etch process with tetramethylammonium hydroxide (TMAH), and wherein the oxide over the set of fins is removed using Diluted Hydro-Fluoric acid (dHF).

11. The method according to claim 9, further comprising:
providing an oxide between each of the set of gates;
forming a first oxide layer over each of the set of gates and over the oxide between each of the set of gates, wherein the sacrificial layer is formed over the first oxide layer;
forming a second oxide layer over the sacrificial layer;
patterning the second oxide layer to form the set of contact placeholders; and
removing the first oxide layer and the second oxide layer remaining exposed following formation of the set of contact placeholders.

12. The method according to claim 8, the set of contact placeholders comprising at least one of the following: amorphous-silicon, polysilicon, and oxide.

13. The method according to claim 8, further comprising:
providing nitride over the set of contact placeholders to form a barrier layer;
depositing a fill material over the semiconductor device following the etching of the barrier layer from the set of contact placeholders, leaving a nitride spacer; and
patterning the fill material between the set of contact placeholders to form the gate contact opening, wherein a layer of nitride remains between the gate contact opening and the set of contact placeholders.

14. The method according to claim 13, the forming the set of S/D contact openings comprising removing the sacrificial layer using an anisotropic etch process with tetramethylammonium hydroxide (TMAH).

\* \* \* \* \*